United States Patent
Komine et al.

(10) Patent No.: US 7,164,960 B2
(45) Date of Patent: Jan. 16, 2007

(54) APPARATUS FOR CORRECTING A PLURALITY OF EXPOSURE TOOLS, METHOD FOR CORRECTING A PLURALITY OF EXPOSURE TOOLS, AND METHOD FOR MANUFACTURING SEMICONDUCTOR DEVICE

(75) Inventors: Nobuhiro Komine, Yokohama (JP); Shigeki Nojima, Yokohama (JP); Keita Asanuma, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 127 days.

(21) Appl. No.: 10/965,162

(22) Filed: Oct. 15, 2004

(65) Prior Publication Data

US 2005/0125178 A1 Jun. 9, 2005

(30) Foreign Application Priority Data

Oct. 17, 2003 (JP) .......................... P2003-357671

(51) Int. Cl.
*G06F 19/00* (2006.01)
(52) U.S. Cl. .......................... 700/110; 700/182; 430/30
(58) Field of Classification Search ........ 700/119–120, 700/182, 121, 110; 430/5, 30, 322, 323, 430/324, 394, 325, 326; 716/21
See application file for complete search history.

(56) References Cited

U.S. PATENT DOCUMENTS

| 6,008,880 A * | 12/1999 | Higashiki et al. ............. 355/53 |
| 6,334,209 B1 * | 12/2001 | Hashimoto et al. ........... 716/21 |
| 2004/0088071 A1 * | 5/2004 | Kouno et al. ................ 700/121 |

FOREIGN PATENT DOCUMENTS

| JP | 2634037 | 4/1997 |
| JP | 10-172878 | 6/1998 |
| JP | 2001-144009 | 5/2001 |
| JP | 2003-031468 | 1/2003 |

* cited by examiner

*Primary Examiner*—Kidest Bahta
(74) *Attorney, Agent, or Firm*—Finnegan, Henderson, Farabow, Garrett & Dunner, L.L.P.

(57) ABSTRACT

An apparatus for correcting a plurality of exposure tools has an image memory configured to store images projected by the exposure tools, a contrast evaluator configured to rank the exposure tools based on contrasts of the images, an evenness evaluator configured to determine whether optical proximity effects of the exposure tools are equivalent or not based on the images, and an exposure tool controller configured to adjust each contrast of the images projected by the exposure tools so that all optical proximity effects of the exposure tools is equivalent to an optical proximity effect of the lowest ranked exposure tool having the lowest contrast.

16 Claims, 12 Drawing Sheets

FIG. 5

| 6AA<br>FOCUS: $F_1$<br>DOSE: $D_1$ | 6AB<br>FOCUS: $F_2$<br>DOSE: $D_1$ | 6AC<br>FOCUS: $F_3$<br>DOSE: $D_1$ |
|---|---|---|
| 6BA<br>FOCUS: $F_1$<br>DOSE: $D_2$ | FOCUS: $F_2$<br>DOSE: $D_2$ | FOCUS: $F_3$<br>DOSE: $D_2$ — 6BC |
| 6CA<br>FOCUS: $F_1$<br>DOSE: $D_3$ | 6BB 6CB<br>FOCUS: $F_2$<br>DOSE: $D_3$ | 6CC<br>FOCUS: $F_3$<br>DOSE: $D_3$ |

APPARATUS FOR CORRECTING A PLURALITY OF EXPOSURE TOOLS, METHOD FOR CORRECTING A PLURALITY OF EXPOSURE TOOLS, AND METHOD FOR MANUFACTURING SEMICONDUCTOR DEVICE

CROSS REFERENCE TO RELATED APPLICATIONS

This application is based upon and claims the benefit of priority from prior Japanese Patent Application P2003-357671 filed on Oct. 17, 2003; the entire contents of which are incorporated by reference herein.

BACKGROUND OF THE INVENTION

1. Field of the Invention

The present invention relates to exposure techniques and in particular to an apparatus for correcting a plurality of exposure tools, a method for correcting a plurality of exposure tools, and a method for manufacturing semiconductor device.

2. Description of the Related Art

As semiconductor devices continue to shrink in size over time, so do the individual circuit patterns. Therefore, reproducing a designed circuit pattern on a wafer by exposing a reticle has recently become difficult. There are many types of exposure tools used in lithography processes. Especially, an exposure tool employing reduction step-and-scan method is one of the representatives. However, since a numerical aperture affects the depth of focus (DOF), problems arise. For example, increasing the numerical aperture imposes restrictions on the resist film thickness. Also, an aberration imposes restrictions on an area of an exposure field.

In Japanese Patent No. 2634037, modifying the shape of a light source in the exposure tool is proposed to solve the problem of decreased DOF. Also, in Japanese Patent Laid-Open Publication No. 2001-144009, tilting a wafer stage in the exposure tool is proposed to solve such problem. However, even though lithography techniques for correcting an individual exposure tool exist, a method for correcting an ununiformity of a plurality of the exposure tools has not been existed.

For example, line width foreshortening is typically observed in the lithography processes. The line width foreshortening depends on a pitch of transparent patterns delineated in the reticle. Such phenomena are called optical proximity effect (OPE). Optical proximity effects of the plurality of the exposure tools are different from each other. Therefore, even though an identical reticle is used for the lithography processes, the line width of the projected patterns varies dependent on the exposure tools. Consequently, uniformity of manufactured semiconductor devices is decreased. Therefore, each reticle should have been modified to adapt to individual OPE of the exposure tool. When semiconductor devices are manufactured by the plurality of the exposure tools, preparing a plurality of the reticles is required, which increases a manufacturing cost of the semiconductor device.

SUMMARY OF THE INVENTION

An aspect of present invention inheres in an apparatus for correcting a plurality of exposure tools according to an embodiment of the present invention. The apparatus includes an image memory configured to store images projected by the exposure tools, a contrast evaluator configured to rank the exposure tools based on contrasts of the images, an evenness evaluator configured to determine whether optical proximity effects of the exposure tools are equivalent or not based on the images, and an exposure tool controller configured to adjust the contrasts of the images projected by the exposure tools so that all optical proximity effects of the exposure tools is equivalent to an optical proximity effect of the lowest ranked exposure tool having the lowest contrast.

Another aspect of the present invention inheres in a method for correcting a plurality of exposure tools according to an embodiment of the present invention. The method includes projecting a standard pattern and a comparative pattern of which size is different from the standard pattern by each of the exposure tools at exposure conditions such that projected images of the standard pattern are equivalent in size, ranking the exposure tools based on contrast of projected images of the comparative pattern exposed at the exposure conditions, projecting a first optical proximity test pattern containing a plurality of openings arranged at first period and a second optical proximity test pattern containing the openings arranged at second period by each of the exposure tools, determining whether optical proximity effects of the exposure tools are equivalent or not based on the projected images of the openings, and adjusting the contrasts of the images projected by the exposure tools so that all optical proximity effects of the exposure tools is equivalent to an optical proximity effect of the lowest ranked exposure tool having the lowest contrast.

Yet another aspect of the present invention inheres in a method for manufacturing a semiconductor device according to an embodiment of the present invention. The method includes projecting a standard pattern and a comparative pattern of which size is different from the standard pattern onto each of a plurality of contrast test wafers by a corresponding plurality of exposure tools at exposure conditions such that projected images of the standard pattern on the contrast test wafers are equivalent in size, ranking the exposure tools based on contrast of projected images of the comparative pattern on the contrast test wafers exposed at the exposure conditions; projecting a circuit pattern of the semiconductor device onto each of a plurality of optical proximity effect test wafers by the exposure tools respectively, determining whether optical proximity effects of the exposure tools are equivalent or not based on the projected images of the circuit pattern on the optical proximity effect test wafers, adjusting the contrasts of the projected images of the circuit pattern on the optical proximity effect test wafers so that all optical proximity effects of the exposure tools is equivalent to an optical proximity effect of the lowest ranked exposure tool having the lowest contrast, applying an optical proximity correction to the circuit pattern in order to reduce the equivalent optical proximity effect and generating corrected circuit pattern of the semiconductor device, and projecting the corrected circuit pattern onto each of a plurality of working wafers on which the semiconductor device is supposed to be fabricated by the exposure tools.

BRIEF DESCRIPTION OF DRAWINGS

FIG. 5 is a diagram of exposure fields on a wafer in accordance with the first embodiment of the present invention;

DETAILED DESCRIPTION OF THE INVENTION

Figure 1:
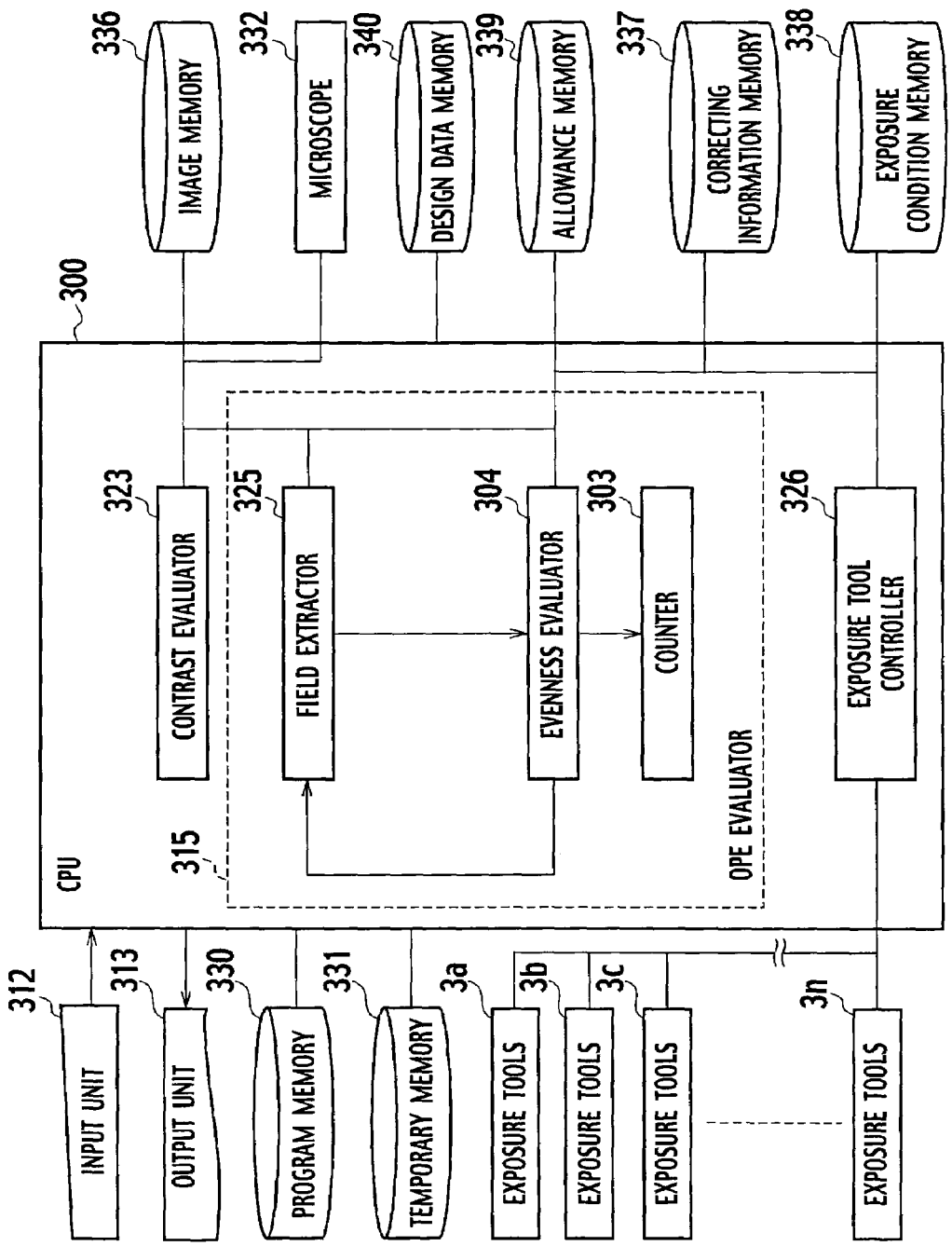
FIG. 1 is a block diagram of an apparatus for correcting a plurality of exposure tools in accordance with a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

With reference now to FIG. 1, an apparatus for correcting a plurality of exposure tools according to a first embodiment has a plurality of exposure tools 3a, 3b, 3c, –, 3n, an image memory, and a central processing unit (CPU) 300. The image memory 336 is configured to store images projected by the exposure tools 3a–3n. The CPU 300 includes a contrast evaluator 323 configured to rank the exposure tools 3a–3n based on contrasts of the images projected by the exposure tools 3a–3n, an evenness evaluator 304 configured to determine whether optical proximity effects of the exposure tools 3a–3n are equivalent or not based on the images, and an exposure tool controller 326 configured to adjust contrasts of the images projected by the exposure tools 3a–3n so that all optical proximity effects of the exposure tools 3a–3n is equivalent to an optical proximity effect of the lowest ranked exposure tool having the lowest contrast.

The apparatus for correcting the plurality of the exposure tools further has a microscope 332, a correcting information memory 337, an exposure condition memory 338, an allowance memory 339, a design data memory 340, an input unit 312, an output unit 313, a program memory 330, and a temporary memory 331.

Figure 2:
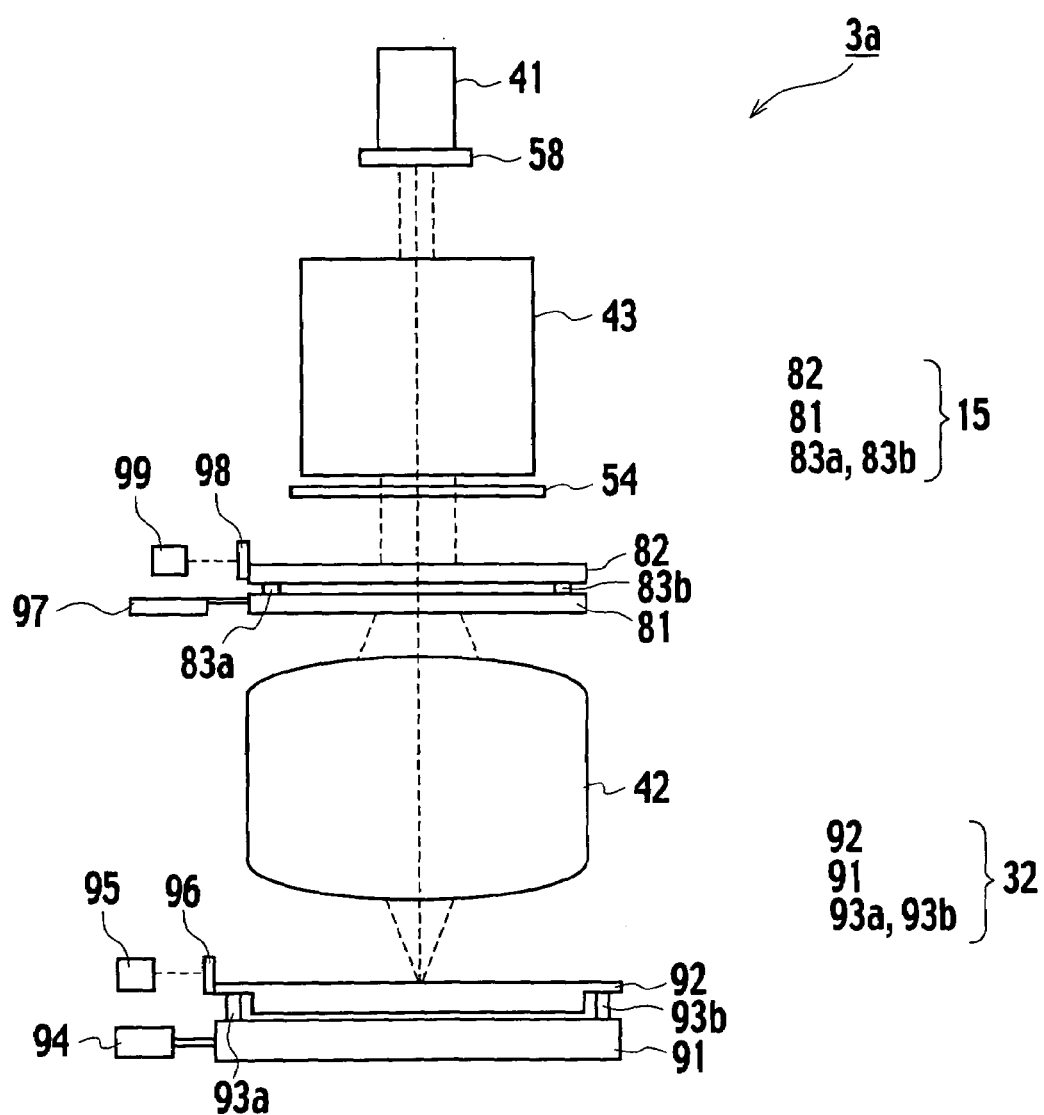
FIG. 2 is a diagram of an exposure tool in accordance with the first embodiment of the present invention.

With reference next to FIG. 2, the exposure tool 3a has a light source 41 emitting a light, an aperture diaphragm holder 58 disposed under the light source 41, an illuminator 43 condensing the light emitted from the light source 41, a slit holder 54 disposed under the illuminator 43, a reticle stage 15 disposed beneath the slit holder 54, a projection optical system 42 disposed beneath the reticle stage 15, and a wafer stage 32 disposed beneath the projection optical system 42.

The reticle stage 15 has a reticle XY stage 81, shafts 83a, 83b provided on the reticle XY stage 81, and a reticle tilting stage 82 attached to the reticle XY stage 81 through the shafts 83a, 83b. The reticle stage 15 is attached to a reticle stage aligner 97. The reticle stage aligner 97 aligns the position of the reticle XY stage 81. Each of the shafts 83a, 83b extends from the reticle XY stage 81. Therefore, the position of the reticle tilting stage 32 is determined by the reticle XY stage 81. And the tilt angle of the reticle tilting stage 32 is determined by the shafts 83a, 83b. Further, a reticle stage mirror 98 is attached to the edge of the reticle tilting stage 82. The position of the reticle tilting stage 82 is monitored by an interferometer 99 disposed opposite the reticle stage mirror 98.

The wafer stage 32 has a wafer XY stage 91, shafts 93a, 93b provided on the wafer XY stage 91, and a wafer tilting stage 92 attached to the wafer XY stage 91 through the shafts 93a, 93b. The wafer stage 32 is attached to a wafer stage aligner 94. The wafer stage aligner 94 aligns the position of the wafer XY stage 91. Each of the shafts 93a, 93b extends from the wafer XY stage 91. Therefore, the position of the wafer tilting stage 92 is determined by the wafer XY stage 91. And the tilt angle of the wafer tilting stage 92 is determined by the shafts 93a, 93b. Further, a wafer stage mirror 96 is attached to the edge of the wafer tilting stage 92. The position of the wafer tilting stage 92 is monitored by an interferometer 95 disposed opposite the wafer stage mirror 96.

It should be noted that each structure of the exposure tools 3b–3n shown in FIG. 1 is similar to the exposure tool 3a shown in FIG. 2. Therefore, detailed figures of the exposure tools 3b–3n are eliminated.

Figure 3:
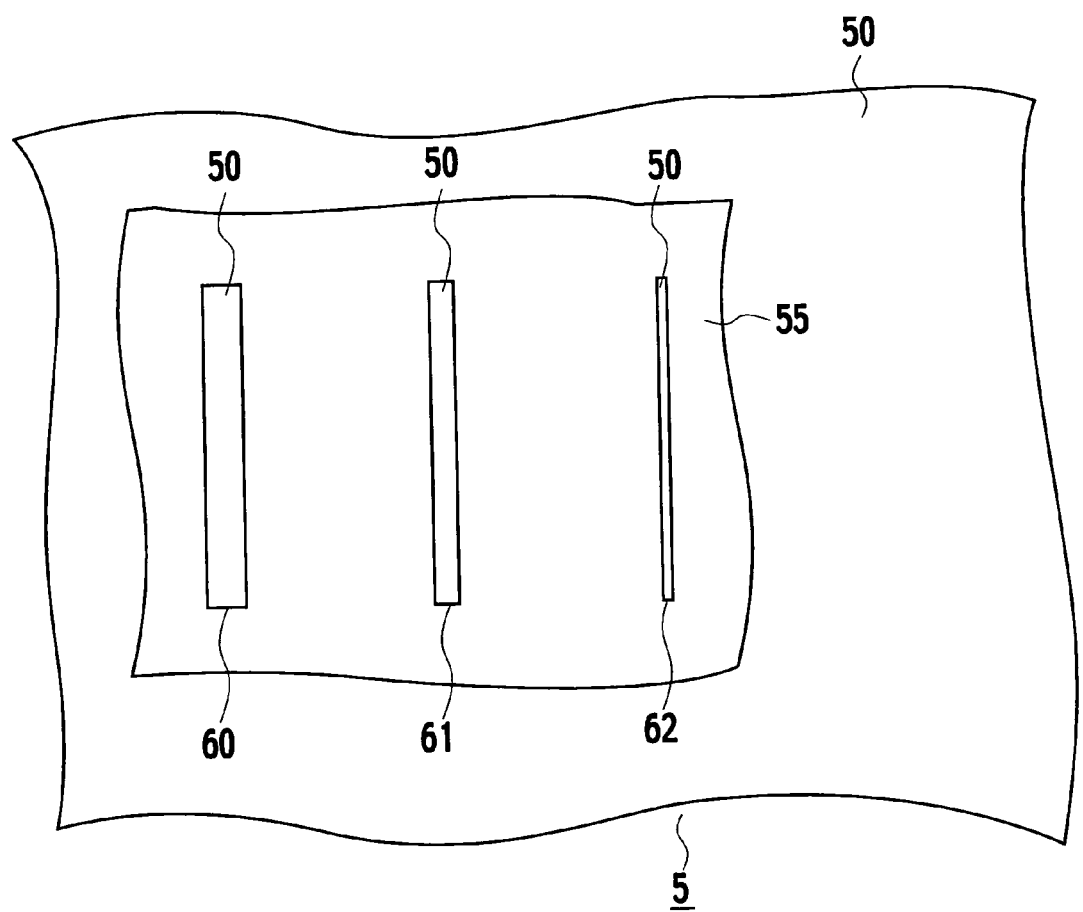
FIG. 3 is a plan view of a contrast test reticle in accordance with the first embodiment of the present invention.

A contrast test reticle 5 shown in FIG. 3 has a transparent mask substrate 50 and a shield layer 55 deposited on the mask substrate 50. The mask substrate 50 is composed of quartz glass and the shield layer 55 is composed of chrome (Cr), for example. A first contrast test pattern 60, a second contrast test pattern 61, and a third contrast test pattern 62 are delineated in the shield layer 55.

Each shape of the first contrast test pattern 60, the second contrast test pattern 61, and the third contrast test pattern 62 is a rectangle. The mask substrate 50 is exposed to the light through the first contrast test pattern 60, the second contrast test pattern 61, and the third contrast test pattern 62. The line width of the second contrast test pattern 61 is shorter than the line width of the first contrast test pattern 60. The line width of the third contrast test pattern 62 is further shorter than the line width of the second contrast test pattern 61.

Figure 4:
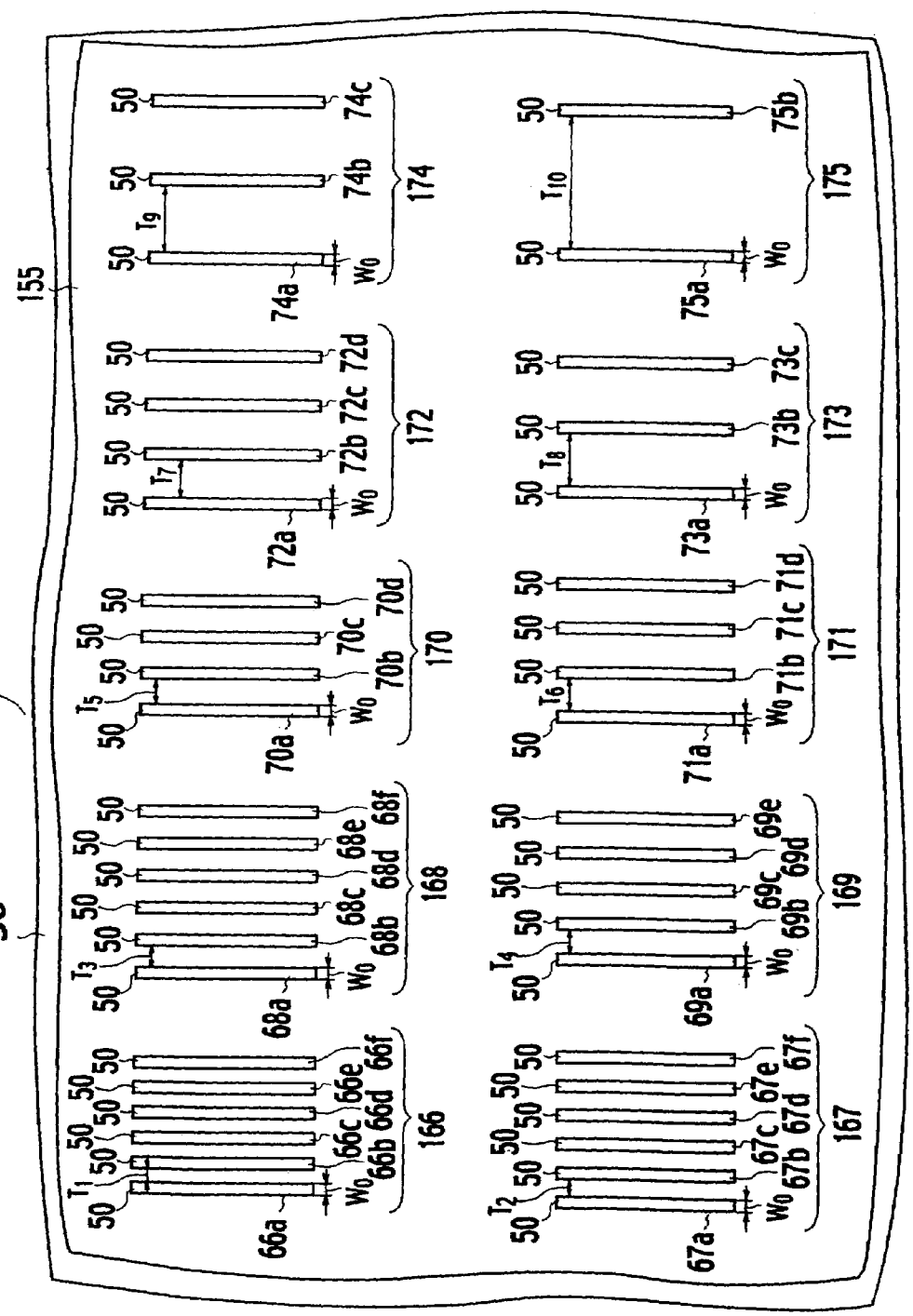
FIG. 4 is a plan view of an OPE test reticle in accordance with the first embodiment of the present invention.

With reference next to FIG. 4, an OPE test reticle 25 has a transparent mask substrate 50 and a shield layer 155 deposited on the mask substrate 50. The mask substrate 50 is composed of quartz glass and the shield layer 155 is composed of chrome (Cr), for example. A first OPE test pattern 166, a second OPE test pattern 167, a third OPE test pattern 168, a fourth OPE test pattern 169, a fifth OPE test pattern 170, a sixth OPE test pattern 171, a seventh OPE test pattern 172, an eighth OPE test pattern 173, a ninth OPE test pattern 174, and a tenth OPE test pattern 175 are delineated in the shield layer 155.

The first OPE test pattern 166 contains openings 66a, 66b, 66c, 66d, 66e, 66f delineated in the shield layer 155. The openings 66a–66f are arranged at first periods "$T_1$". The second OPE test pattern 167 contains openings 67a, 67b, 67c, 67d, 67e, 67f delineated in the shield layer 155. The openings 67a–67f are arranged at second periods "$T_2$".

The third OPE test pattern 168 contains openings 68a, 68b, 68c, 68d, 68e, 68f delineated in the shield layer 155. The openings 68a–68f are arranged at third periods "$T_3$". The fourth OPE test pattern 169 contains openings 69a, 69b, 69c, 69d, 69e delineated in the shield layer 155. The openings 69a–69e are arranged at fourth periods "$T_4$".

The fifth OPE test pattern 170 contains openings 70a, 70b, 70c, 70d delineated in the shield layer 155. The openings 70a–70d are arranged at fifth periods "$T_5$". The sixth OPE test pattern 171 contains openings 71a, 71b, 71c, 71d delineated in the shield layer 155. The openings 71a–71d are arranged at sixth periods "$T_6$".

The seventh OPE test pattern 172 contains openings 72a, 72b, 72c, 72d delineated in the shield layer 155. The openings 72a–72d are arranged at seventh periods "$T_7$". The eighth OPE test pattern 173 contains openings 73a, 73b, 73c delineated in the shield layer 155. The openings 73a–73c are arranged at eighth periods "$T_8$".

The ninth OPE test pattern 174 contains openings 74a, 74b, 74c delineated in the shield layer 155. The openings 74a–74c are arranged at ninth periods "$T_9$". The tenth OPE test pattern 175 contains openings 75a, 75b delineated in the shield layer 155. The openings 75a, 75b are arranged at tenth periods "$T_{10}$".

Each shape of the openings 66a–66f, 67a–67f, 68a–68f, 69a–69e, 70a–70d, 71a–71d, 72a–72d, 73a–73c, 74a–74c, 75a, and 75b is that of a congruent rectangle and has the line width $W_0$. The mask substrate 50 is exposed to the light through the openings 66a–66f, 67a–67f, 68a–68f, 69a–69e, 70a–70d, 71a–71d, 72a–72d, 73a–73c, 74a–74c, 75a, and 75b.

The first period "$T_1$" has a same length as the line width $W_0$. The second period "$T_2$" is 1.25 times as long as the line width $W_0$. The third period "$T_3$" is 1.5 times as long as the line width $W_0$. The fourth period "$T_4$" is 1.75 times as long as the line width $W_0$. The fifth period "$T_5$" is twice as long as the line width $W_0$. The sixth period "$T_6$" is 2.5 times as long as the line width $W_0$. The seventh period "$T_7$" is three times as long as the line width $W_0$. The eighth period "$T_8$" is four times as long as the line width $W_0$. The ninth period "$T_9$" is five times as long as the line width $W_0$. And the tenth period "$T_{10}$" is 10 times as long as the line width $W_0$. Design data of the OPE test reticle 25 is stored in the design data memory 340 shown in FIG. 1.

The exposure condition memory 338 stores exposure conditions for step and scan processes by the exposure tools 3a–3n. FIG. 5 shows example exposure conditions on a wafer surface. The area of the wafer surface is divided into exposure fields 6AA, 6AB, 6AC, 6BA, 6BB, 6BC, 6CA, 6CB, 6CC. In each of the exposure fields 6AA–6CC, a focus condition $F_i$ (i=1, 2, 3) and a dose condition $D_j$ (J=1, 2, 3) for exposing the contrast test reticle 5 or the OPE test reticle 25 shown in FIGS. 3 and 4 to the light are defined.

With reference again to FIG. 1, an atomic force microscope (AFM) or a scanning electron microscope (SEM) may be used for the microscope 332. The microscope 332 obtains contrast evaluation images and OPE evaluation images. The "contrast evaluation images" are projected images of the contrast test reticle 5 shown in FIG. 3 by the exposure tools 3a–3n. The contrast evaluation images are printed under the exposure condition shown in FIG. 5. The "OPE evaluation images" are projected images of the OPE test reticle 25 shown in FIG. 4 by the exposure tools 3a–3n. The OPE evaluation images are also printed under the exposure condition shown in FIG. 5. The image memory 336 shown in FIG. 1 stores the contrast evaluation images and the OPE evaluation images.

The contrast evaluator 323 shown in FIG. 1 ranks the exposure tools 3a–3n hierarchically based on the contrast evaluation images printed by the exposure tools 3a–3n. Further, the contrast evaluator 323 defines each of the exposure tools 3a–3n as an N-th exposure tool (N=1, 2, 3, –, n) based on the rank of contrast. A method for ranking the exposure tools 3a –3n hierarchically is described as follow.

The contrast evaluator 323 accesses the image memory 336 to analyze the contrast evaluation images printed by the exposure tools 3a, 3b. Then, the contrast evaluator 323 randomly chooses a standard pattern among the first contrast test pattern 60, the second contrast test pattern 61, and the third contrast test pattern 62 shown in FIG. 3. The contrast evaluator 323 shown in FIG. 1 also defines other patterns except for the standard pattern as a comparative pattern. The case where the first contrast test pattern 60 shown in FIG. 3 is chosen as the standard pattern is described below.

Figure 6:
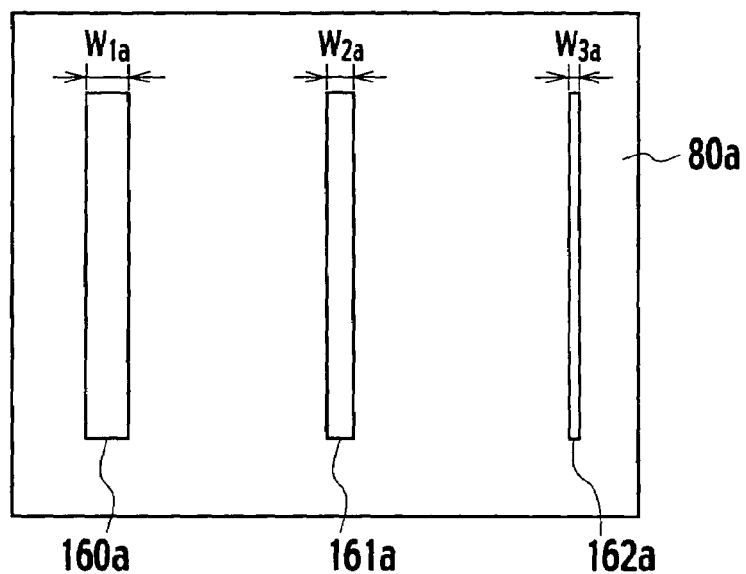
FIG. 6 is a first plan view of a projected image of the OPE test reticle in accordance with the first embodiment of the present invention.
Figure 7:
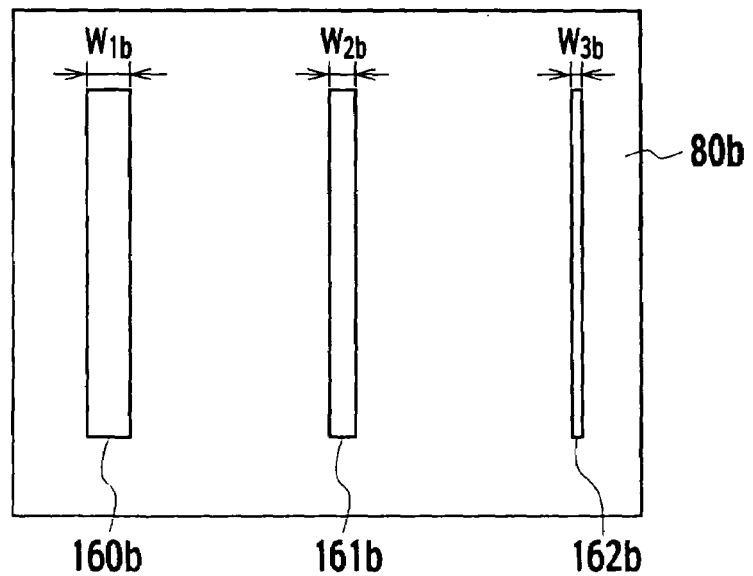
FIG. 7 is a second plan view of a projected image of the OPE test reticle in accordance with the first embodiment of the present invention.

The contrast evaluator 323 compares the contrast evaluation images printed by the exposure tools 3a, 3b shown in FIG. 1. By comparing, the contrast evaluator 323 searches one exposure condition where each line width of the projected standard patterns by the exposure tools 3a, 3b is equivalent. Then, the contrast evaluator defines a field exposed under such exposure condition as a contrast test field. FIG. 6 shows an example contrast test field by the exposure tool 3a. FIG. 7 shows an example contrast test field by the exposure tool 3b. In FIGS. 6 and 7, each of projected first contrast test pattern 160a, 160b on resist films 80a, 80b is a projected image of the first contrast test pattern 60 that is shown in FIG. 3 and is defined as the standard pattern. In FIGS. 6 and 7, the line width "$W_{1a}$" of the projected first contrast test pattern 160a and the line width "$W_{1b}$" of the projected first contrast test pattern 160b are equivalent. Each of projected second contrast test pattern 161a, 161b is a projected image of the second contrast test pattern 61 defined as the comparative pattern. And, each of projected third contrast test pattern 162a, 162b is a projected image of the third contrast test pattern 62 defined as the comparative pattern.

The contrast evaluator 323 compares the line width "$W_{2a}$" of the projected second contrast test pattern 161a with the line width "$W_{2b}$" of the projected second contrast test pattern 161b. Also, the contrast evaluator 323 compares the line width "$W_{3a}$" of the projected third contrast test pattern 162a with the line width "$W_{3b}$" of the projected third contrast test pattern 162b. In a case where $W_{2a} \geq W_{2b}$ and $W_{3a} > W_{3b}$ are held as shown in FIGS. 6 and 7, the contrast evaluator 323 determines that the contrast of the exposure tool 3a shown in FIG. 1 is higher than the contrast of the exposure tool 3b. Further, the contrast evaluator 323 defines the exposure tool 3a as a 1st ranked exposure tool and also defines the exposure tool 3b as a 2nd ranked exposure tool. In above description, the first contrast test pattern 60 is defined as the standard pattern. However, it should be noted that defining the second contrast test pattern 61 or the third contrast test pattern 62 as the standard pattern and comparing other patterns as the comparative patterns are available for the ranking of the contrast.

Thereafter, the contrast evaluator 323 compares the contrast of the exposure tool 3b with the contrast of the exposure tool 3c by the same way. In a case where the contrast of the exposure tool 3c is lower than the contrast of the exposure tool 3b, the contrast evaluator 323 defines the exposure tool 3c as a 3rd ranked exposure tool. On the other hand, in a case where the contrast of the exposure tool 3c is higher than the contrast of the exposure tool 3b, the exposure tool 3b is redefined as the 3rd ranked exposure tool. Then, the contrast evaluator 323 compares the contrast of the exposure tool 3c with the contrast of the exposure tool 3a. In a case where the contrast of the exposure tool 3c is higher than the contrast of the exposure tool 3a, the contrast evaluator 323 redefines the exposure tool 3a as the 2nd ranked exposure tool. Also, the contrast evaluator 323 defines the exposure tool 3c as the 1st ranked exposure tool. In a case where the contrast evaluator 323 determines that the contrast of the exposure tool 3c is lower than the contrast of the exposure tool 3a, the contrast evaluator 323 defines the exposure tool 3c as the 2nd ranked exposure tool. In such a way, all contrast of the exposure tools 3a –3n are compared and the contrast evaluator 323 ranks the contrasts of the exposure tools 3a–3n hierarchically. Consequently, each of the exposure tools 3a–3n is defined as the N-th ranked exposure tool (N=1, 2, 3, ..., n). If the number of the exposure tools 3a–3n is "n", an n-th ranked exposure tool means the lowest ranked exposure tool having the lowest contrast.

With reference again to FIG. 1, the CPU 300 has an OPE evaluator 315. The OPE evaluator 315 has a counter 303, a field extractor 325, and the evenness evaluator 304. The counter 303 registers a variable "N". The variable "N" is varied to a natural number and the maximum value of the variable "N" is the number of the exposure tools 3a–3n.

The field extractor 325 analyzes the OPE evaluation image by the N-th ranked exposure tool stored in the image memory 336. From the analysis of the surface topology recorded in the OPE evaluation image under the exposure condition shown in FIG. 5, the field extractor 325 searches a selected focus condition that is optimum for projecting. Further, the field extractor 325 compares a design data of the OPE test reticle 25 and images of the exposure fields exposed under the selected focus condition and the dose conditions $D_1$, $D_2$, $D_3$. Thereafter, the field extractor 325 defines one exposure field where the line width of the projected image is nearest to the design data as an OPE test field.

The evenness evaluator 304 determines whether the OPE of the N-th ranked exposure tool is equivalent to the OPE of the (N−1)-th ranked exposure tool. An example method for determining is described below.

The evenness evaluator 304 extracts the line width data of the projected images of the openings 66a–66f, 67a–67f, 68a–68f, 69a–69e, 70a–70d, 71a–71d, 72a–72d, 73a–73c, 74a–74c, 75a, 75b shown in FIG. 4 from the OPE test field obtained by the N-th ranked exposure tool. Then, the evenness evaluator 304 defines a line width data group of the N-th ranked exposure tool. The population of the "line width data group" is the extracted line width data. Further, the evenness evaluator 304 defines a line width data group of the (N−1)-th ranked exposure tool in a same way.

A significance level for determining whether the OPE of the N-th ranked exposure tool and the OPE of the (N−1)-th ranked exposure tool are equivalent or not is stored in the allowance memory 339 shown in FIG. 1. Accessing the significance level, the evenness evaluator 304 examines the difference between the central values of the line width data groups of the N-th ranked exposure tool and of the (N−1)-th ranked exposure tool by the Mann-Whitney test, for example. If the evenness evaluator 304 determines that significant difference exists, the evenness evaluator 304 determines that the. OPE of the N-th ranked exposure tool and the OPE of the (N−1)-th ranked exposure tool are not equivalent. On the other hand, if the evenness evaluator 304 determines that the significant difference does not exist, the evenness evaluator 304 determines that the OPE of the N-th ranked exposure tool and the OPE of the (N−1)-th ranked exposure tool are equivalent. When both optical proximity effects of the N-th and (N−1) th ranked exposure tools are equivalent, the evenness evaluator 304 instructs the counter 303 to subtract one from the variable "N" and redefine the subtracted value as the variable "N".

The exposure tool controller 326 controls the exposure conditions of the exposure tools 3a–3n. For example, the exposure tool controller 326 instructs the reticle stage aligner 97 and wafer stage aligner 94 shown in FIG. 2 to shift and tilt the reticle stage 15 and the wafer stage 32. The exposure tool controller 326 also monitors the orientation, the shift direction, and the shift speed of the reticle stage 15 and the wafer stage 32 by using the interferometer 99 and the interferometer 95.

The correcting information memory 337 shown in FIG. 1 is configured to store contrasts adjusted by the exposure tool controller 326. The contrasts adjusted by the exposure tool controller 326 contains the exposure tool conditions such as the orientations and tilt angles of the reticle stage 15 and the wafer stage 32 shown in FIG. 2 calculated by the exposure tool controller 326.

A keyboard and a mouse may be used for the input unit 312. An LCD and an LED may be used for the output unit 313. The program memory 330 stores a program instructing the CPU 300 to transfer data with apparatuses connected to the CPU 300. The temporary memory 331 stores a temporary data calculated during operation by the CPU 300.

Figure 8:
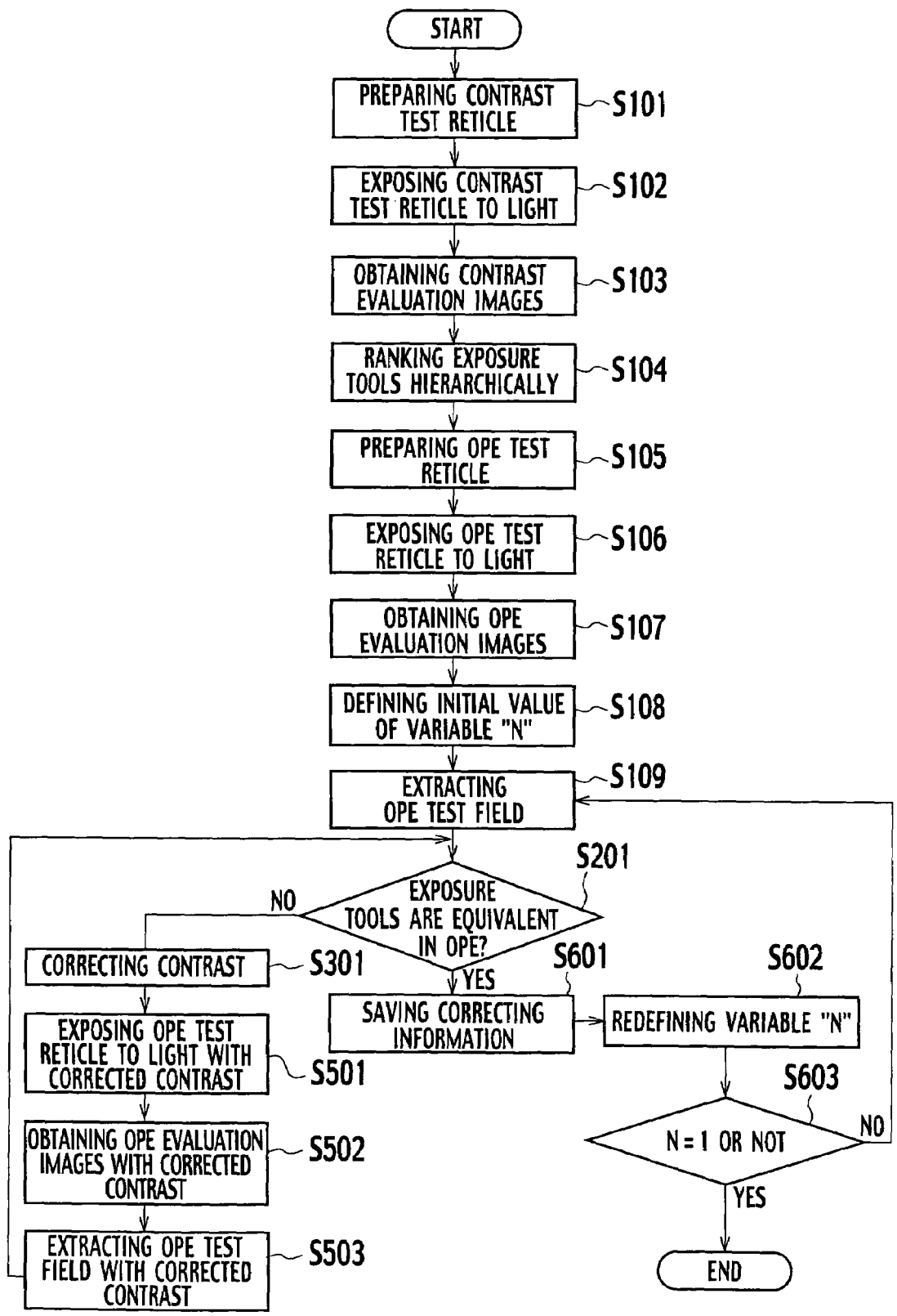
FIG. 8 is a flowchart depicting a method for correcting exposure tools in accordance with the first embodiment of the present invention.

With reference next to FIG. 8, a method for correcting exposure tools according to the first embodiment of the present invention is described.

In a step S101, a contrast test wafer and the contrast test reticle 5 shown in FIG. 3 are mounted in each of the exposure tools 3a–3n shown in FIG. 1. All contrast test wafers mounted in the exposure tools 3a –3n have same substrate, same resist, and same resist film thickness.

In a step S102, the exposure tool controller 326 accesses the exposure condition shown in FIG. 5 stored in the exposure condition memory 338 shown in FIG. 1. Thereafter, the exposure tool controller 326 controls the exposure tools 3a–3n under the exposure condition. Then, the first contrast test pattern 60, the second contrast test pattern 61, and the third contrast test pattern 62 of the contrast test reticle 5 shown in FIG. 3 are projected onto each of the exposure fields 6AA–6CC of the contrast test wafers mounted in the exposure tools 3a–3n. Thereafter, the contrast test wafers are developed.

In a step S103, the microscope 332 shown in FIG. 1 obtains the contrast evaluation images of the exposure tools 3a–3n by observing the contrast test wafers. Thereafter, the contrast evaluation images are stored in the image memory 336.

In a step S104, the contrast evaluator 323 ranks the exposure tools 3a–3n hierarchically based on the contrast evaluation image stored in the contrast evaluator 323. Subsequently, the contrast evaluator 323 defines each of the exposure tools 3a–3n as the N-th ranked exposure tool (N=1, 2, 3, –, n).

In a step S105, the OPE test wafer and the OPE test reticle 25 shown in FIG. 4 are mounted in each of the exposure tools 3a–3n shown in FIG. 1. Each OPE test wafer has same substrate, resist composition, and resist film thickness.

In a step S106, the exposure tool controller 326 accesses the exposure condition shown in FIG. 5 stored in the exposure condition memory 338 shown in FIG. 1. Subsequently, the exposure tool controller 326 controls the exposure tools 3a–3n under the exposure condition. The first OPE test pattern 166, a second OPE test pattern 167, a third OPE test pattern 168, a fourth OPE test pattern 169, a fifth OPE test pattern 170, a sixth OPE test pattern 171, a seventh OPE test pattern 172, an eighth OPE test pattern 173, a ninth OPE test pattern 174, and a tenth OPE test pattern 175 of the OPE test reticle 25 shown in FIG. 4 are projected onto each of the exposure fields 6AA–6CC of the OPE test wafers. Then, the OPE test wafers are developed.

In a step S107, the microscope 332 shown in FIG. 1 obtains each OPE evaluation image of the exposure tools 3a–3n by observing the OPE test wafers. The OPE evaluation images are stored in the image memory 336. In step S108, the counter 303 shown in FIG. 1 defines the number of the exposure tools 3a–3n as the initial value of the variable "N". The counter 303 informs the field extractor 325 of the initial value of the variable "N". If the number of the exposure tools 3a–3n is "n", the initial value means "n".

In a step S109, the field extractor 325 extracts the OPE test field from the OPE evaluation image of the N-th ranked exposure tool stored in the image memory 336. The field extractor 325 informs the evenness evaluator 304 of the extracted OPE test field of the N-th ranked exposure tool. Thereafter, the field extractor 325 extracts the OPE test field of the (N–1)-th ranked exposure tool and informs the evenness evaluator 304 of the OPE test field of the (N–1)-th ranked exposure tool.

Figure 9:
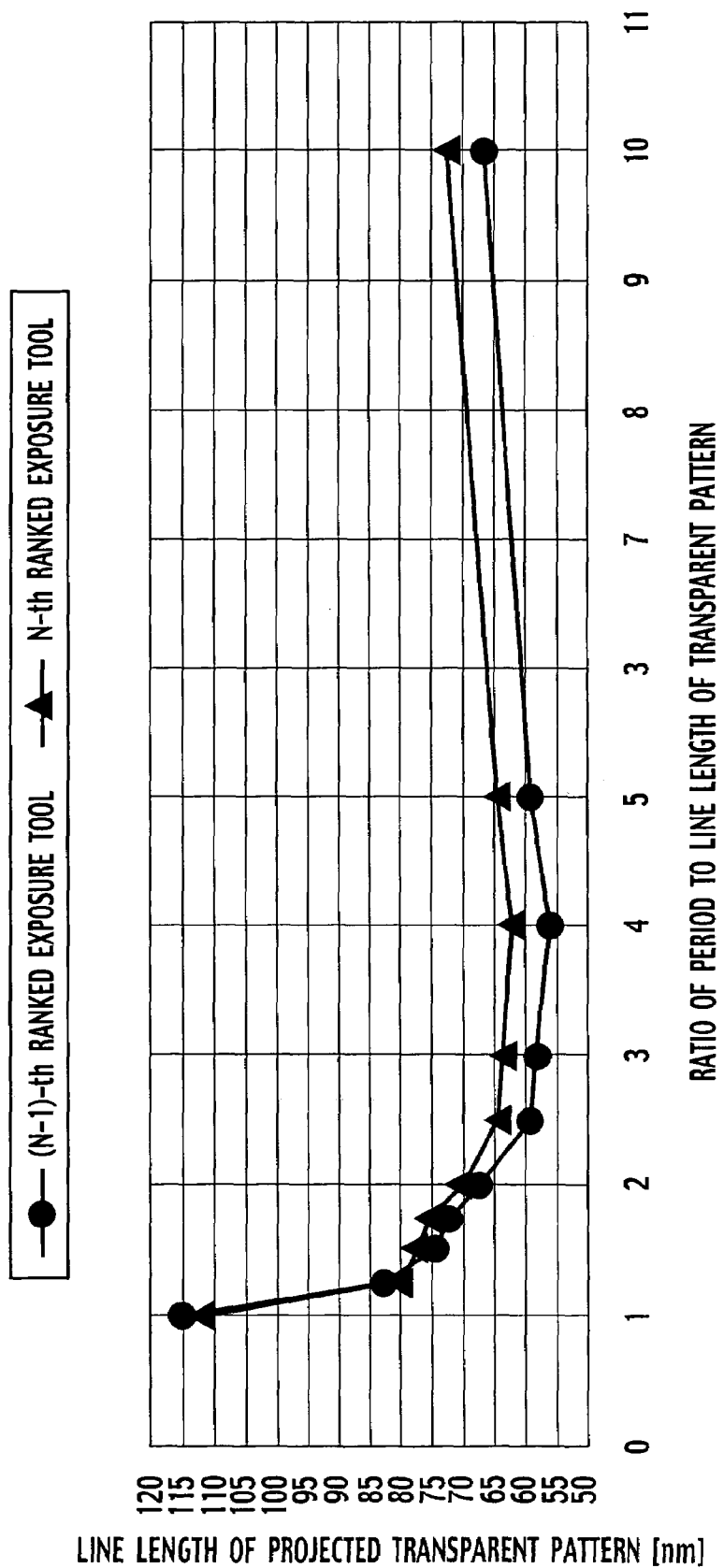
FIG. 9 is a first sample graph of OPE tests in accordance with the first embodiment of the present invention.
Figure 10:
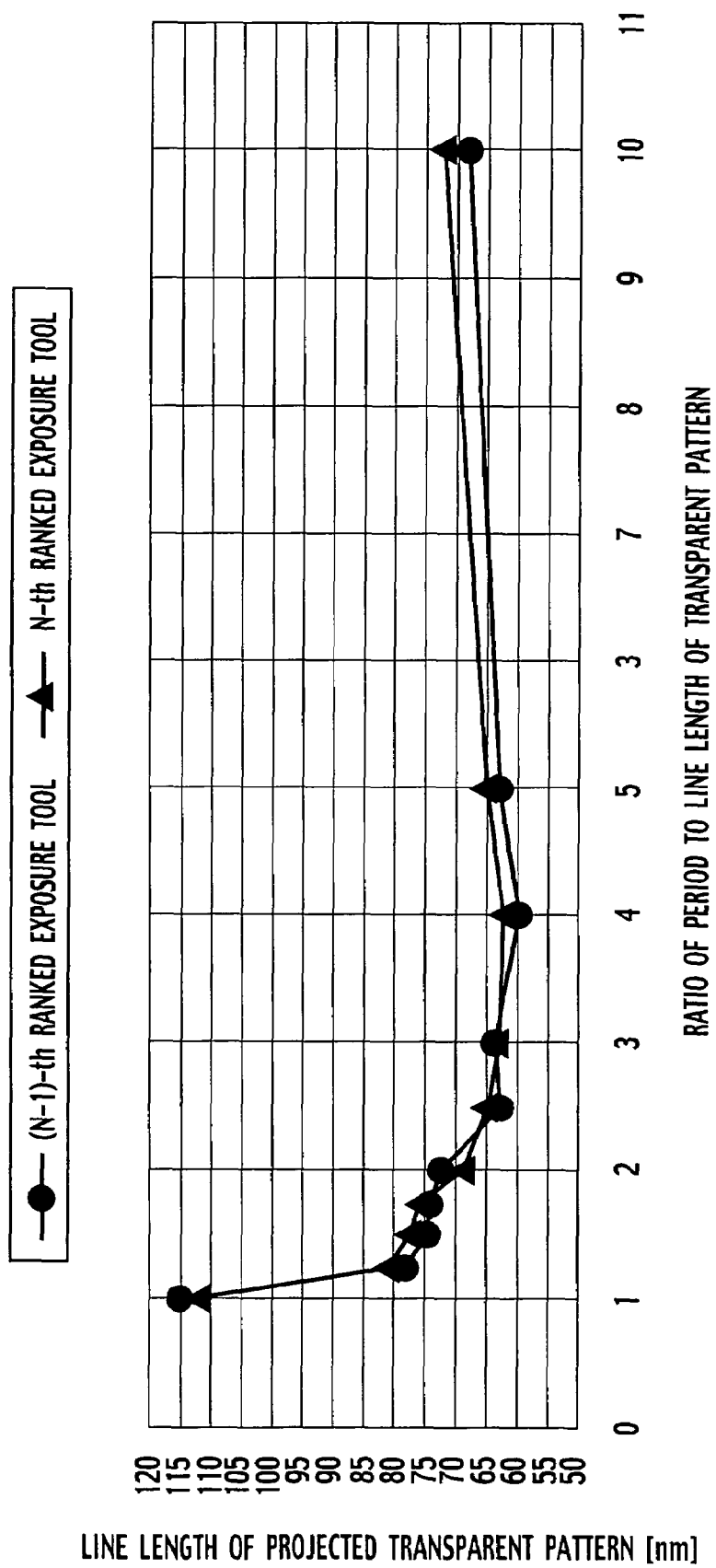
FIG. 10 is a second sample graph of OPE tests in accordance with the first embodiment of the present invention.

In a step S201, the evenness evaluator 304 determines whether the optical proximity effects of the N-th and (N–1)-th ranked exposure tools are equivalent or not. FIG. 9 shows exampled line width data groups of the N-th and (N–1)-th ranked exposure tools. If the evenness evaluator 304 determines that the optical proximity effects of the N-th and (N–1)-th ranked exposure tools are not equivalent by examining the line width data groups shown in the FIG. 9, the evenness evaluator 304 deletes the information of the OPE test field of the (N–1)-th ranked exposure tool and process advance to a step S301. On the other hand, if the relationship of the line width data groups appears in FIG. 10 and the evenness evaluator 304 determines that the optical proximity effects of the N-th and (N–1)-th ranked exposure tools are equivalent, process advances to a step S601.

In the step S301, the exposure tool controller 326 shown in FIG. 1 instructs the wafer stage aligner 94 shown in FIG. 2 to tilt the wafer stage 32 of the (N–1)-th ranked exposure tool. Accordingly, the contrast of the (N–1)-th ranked exposure tool is reduced so that the optical proximity effects of the N-th and (N–1)-th ranked exposure tools are equivalent. The tilt angle of the wafer stage 32 may be calculated by an optical simulation. Making a data table recording the relationship between the line and space ratio of transparent patterns and the line length of the projected image of the transparent patterns under a plurality of tilt angle conditions and extracting an appropriate tilt angle from the data table are also alternative.

In steps S501, S502, and S503, the OPE evaluation image and the OPE test field of the (N–1)-th ranked exposure tool are obtained. The obtained OPE evaluation image is stored in the image memory 336. The obtained OPE test field is transmitted to the evenness evaluator 304. The methods for obtaining the OPE evaluation image and the OPE test field in steps S501, S502, and S503 are similar to the steps S106, S107, and S109. Therefore, detailed description is eliminated.

In the step S601, the tilt angle of the wafer stage 32 shown in FIG. 2 in the (N–1)-th ranked exposure tool is monitored by the interferometer 95. The value of the tilt angle is transmitted to the exposure tool controller 326 shown in FIG. 1 and also is stored in the correcting information memory 337 as the contrasts adjusted by the exposure tool controller 326. The focus and dose conditions in a case where the OPE test field is extracted in the step S109 and the step S503 are also stored in the correcting information memory 337.

In a step S602, the counter 303 subtracts one from the variable "N". Subsequently, the counter 303 redefines the subtracted value as the variable "N". In a step S603, the counter 303 determines whether the variable "N" is one or not. If the variable "N" is not one, process advances to the step S109. If the variable "N" is one, it means all of the exposure tools 3a–3n are corrected and the all optical proximity effects of the exposure tools 3a–3n are equivalent. Therefore, the method for correcting exposure tools according to the first embodiment of the present invention is completed.

As described above, the method for correcting the plurality of the exposure tools according to the first embodiment makes the optical proximity effects of the exposure tools 3a–3n equivalent. In an earlier technology, there has been no method for making the optical proximity effects of the plurality of exposure tools equivalent. Therefore, even though the identical reticle is mounted in each of the exposure tools, projected images have not been even since the optical proximity effects of the exposure tools are not even. It decreases the uniformity of the manufactured semiconductor devices.

However, it is possible to make the optical proximity effects of the exposure tools even by the apparatus and the method for correcting the plurality of the exposure tools according to the first embodiment. Since the contrasts adjusted by the exposure tool controller 326 for making the optical proximity effects of the exposure tools even is stored in the step S601, the manufacturing error is effectively reduced when the semiconductor devices are manufactured by the exposure tools 3a–3n.

The significance level stored in the allowance memory 339 is 3% to 7%, for example. If the significance level is larger than 7%, uniformity of the manufactured semiconductor devices may be decreased. If the significance level is lower than 3%, the correcting time may be increased wastefully since the uniformity of the manufactured semiconductor device may remain stably under the significance level of 3%.

(Second Embodiment)

Figure 11:
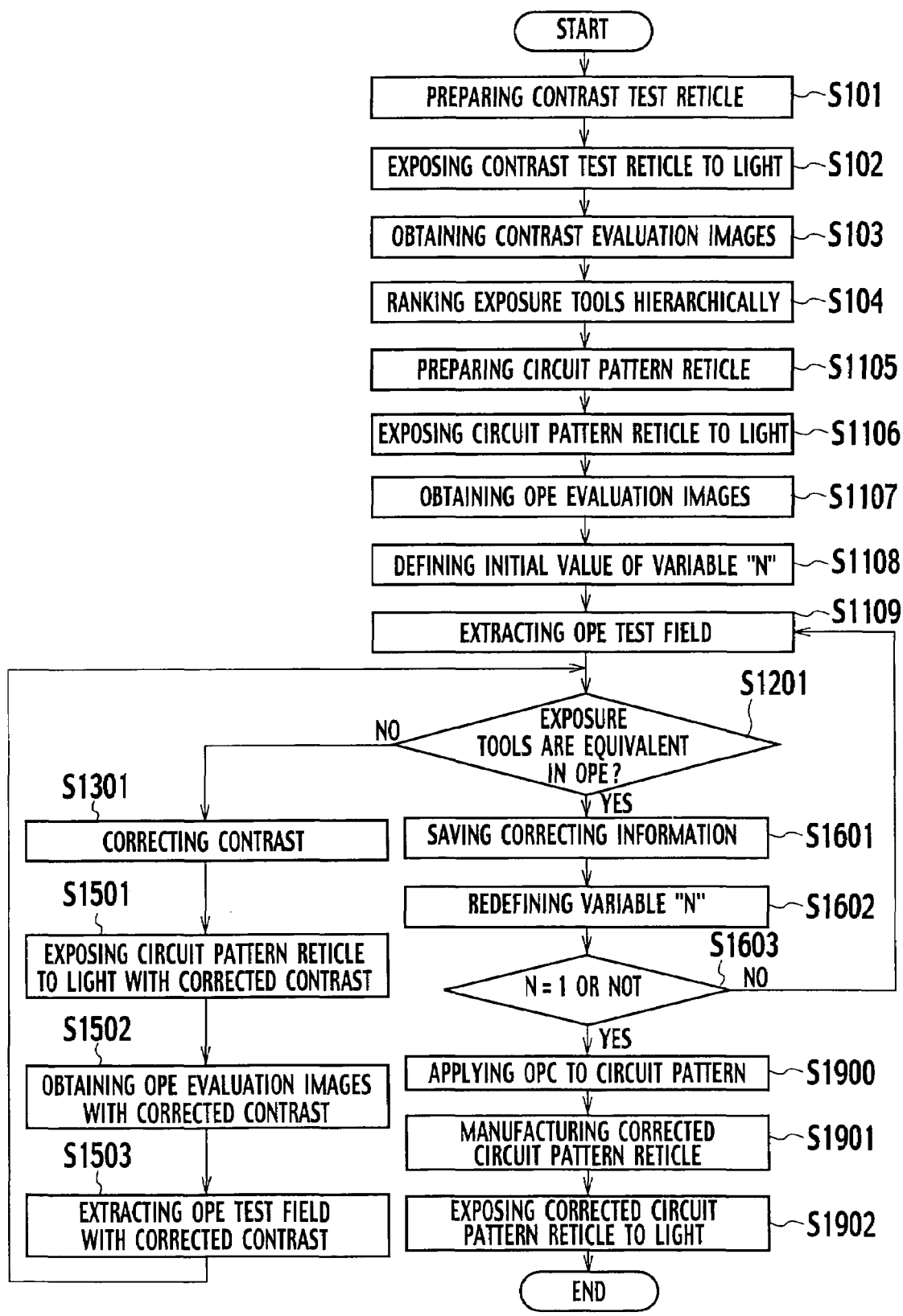
FIG. 11 is a flowchart depicting a method for manufacturing semiconductor device in accordance with the second embodiment of the present invention.

With reference to FIG. 11, a method for manufacturing a semiconductor device according to a second embodiment is described. The method for manufacturing the semiconductor device is executed by the apparatus for correcting the plurality of the exposure tools shown in FIG. 1. In a case where the method for manufacturing the semiconductor device is executed, the design data memory 340 stores circuit pattern design data for the semiconductor device. Except for the design data memory 340, details of other elements of the apparatus for correcting the plurality of the exposure tools are similar to the description of the first embodiment.

In steps S101–S104 shown in FIG. 11, the exposure tools 3a–3n shown in FIG. 1 is ranked hierarchically based on the contrast of images projected by the exposure tools 3a–3n. Further, each of the exposure tools 3a–3n is defined as the N-th ranked exposure tool (N=1, 2, 3, –, n). The procedure for steps S101–S104 shown in FIG. 11 is similar to in FIG. 8.

In a step S1105, a circuit pattern reticle and the OPE test wafer are mounted in each of the exposure tools 3a–3n. Each OPE test wafer has same substrate, resist composition, and resist film thickness.

In steps S1106–S1108, the circuit pattern delineated in the circuit pattern reticle is projected onto each of the exposure fields 6AA–6CC of the OPE test wafers. The procedure for projecting the circuit pattern is similar to the procedure for projecting the OPE test patterns 166–175 described in the steps S106-S108 shown in FIG. 8.

In a step S1109 shown in FIG. 11, the field extractor 325 shown in FIG. 1 analyzes a surface topology recorded in an OPE evaluation image of the N-th ranked exposure tool stored in the image memory 336. Subsequently, the field extractor 325 determines that one of the focus conditions $F_1$, $F_2$, $F_3$ is the selected focus condition based on the analysis. Further, the field extractor 325 compares the circuit pattern design data stored in the design data memory 340 and images of the exposure fields exposed under the selected focus condition and each of the dose conditions $D_1$, $D_2$, $D_3$. Thereafter, the field extractor 325 defines one exposure field where the projected image is nearest to the design data as the OPE test field. The field extractor 325 informs the evenness evaluator 304 of the extracted OPE test field of the N-th ranked exposure tool. Thereafter, the field extractor 325 extracts the OPE test field of the (N−1)-th ranked exposure tool and informs the evenness evaluator 304 of the OPE test field of the (N−1)-th ranked exposure tool.

In a step S1201, evenness evaluator 304 extracts the line width data of the projected circuit pattern from the OPE test field obtained by the N-th ranked exposure tool. Also, the evenness evaluator 304 defines a line width data group of the N-th ranked exposure tool of which population is the extracted line width data. Further, the evenness evaluator 304 defines a line width data group of the (N−1)-th ranked exposure tool in a same way. Thereafter, the evenness evaluator 304 determines whether the optical proximity effects of the N-th and (N−1)-th ranked exposure tools are equivalent or not. If the evenness evaluator 304 determines that the optical proximity effects of the N-th and (N−1)-th ranked exposure tools are not equivalent, the evenness evaluator 304 deletes the information of the OPE test field of the (N−1)-th ranked exposure tool and process advance to a step S1301. On the other hand, if the evenness evaluator 304 determines that the optical proximity effects of the N-th and (N−1)-th ranked exposure tools are equivalent, process advances to a step S1601.

In steps S1301, S1501, S1502, and S1503, the contrast of the (N−1)-th ranked exposure tool is reduced so that the optical proximity effects of the N-th and (N−1)-th ranked exposure tools are equivalent. Thereafter, the OPE evaluation image and the OPE test field of the (N−1)-th ranked exposure tool are obtained as described in the steps S301, S501, S502, S503 shown in FIG. 8.

In the step S1601, the tilt angle of the wafer stage 32 shown in FIG. 2 in the (N−1)-th ranked exposure tool is monitored by the interferometer 95. The value of the tilt angle is transmitted to the exposure tool controller 326 shown in FIG. 1 and also is stored in the correcting information memory 337. The focus and dose conditions in a case where the OPE test field is extracted in the step S1109 and the step S1503 are stored in the correcting information memory 337.

In a step S1602, the counter 303 subtracts one from the variable "N". Subsequently, the counter 303 redefines the subtracted value as the variable "N". In a step S1603, the counter 303 determines whether the variable "N" is one or not. If the variable "N" is not one, process advances to the step S1109. If the variable "N" is one, process advances to a step S1900.

When the process advances to the step S1900, all of the exposure tools 3a–3n are corrected and the all optical proximity effects of the exposure tools 3a–3n are equivalent to the OPE of the N-th ranked exposure tool. Thereafter, the optical proximity correction (OPC) is applied to the circuit pattern of the semiconductor device based on the shape of the projected circuit pattern on the OPE test field obtained by the N-th ranked exposure tool in the step S1109. By the OPC, a corrected circuit pattern of the semiconductor device is generated.

In a step S1901, a corrected circuit pattern reticle having the corrected circuit pattern is manufactured. In a step S1902, the corrected circuit pattern reticle is held on the wafer stage 32 shown in FIG. 2 in each of the exposure tools 3a–3n. Also, a working wafer on which the semiconductor device is supposed to be fabricated is held on the reticle stage 15 in each of the exposure tools 3a–3n. Then, the exposure tool controller 326 tilts each wafer stage 32 of the exposure tools 3a–3n based on the adjusted contrast conditions stored in the correcting information memory 337. Further, the exposure tool controller 326 accesses each selected focus and dose condition of the exposure tools 3a–3n stored in the correcting information memory 337. Under the selected focus and dose conditions, each of the exposure tools 3a–3n prints the corrected circuit pattern on the working wafer.

The method for manufacturing the semiconductor device according to the second embodiment makes it possible to manufacture the equivalent semiconductor devices by a plurality of the exposure tools 3a–3n. In an earlier technology, there was no method for making the optical proximity effects of the plurality of exposure tools equivalent. Therefore, each reticle has been modified to adapt for each exposure tool when the OPC is applied. Accordingly, it has been required to prepare for a plurality of reticles, even though manufactured semiconductor devices is same. Therefore, a plurality of OPC simulation has been required for the plurality of reticles. Also, preparing the plurality of reticles has increased manufacturing cost for the semiconductor devices.

However, the method for manufacturing the semiconductor device according to the second embodiment makes the optical proximity effects of the exposure tools even. Accordingly, it is possible to reduce OPC simulation time and there is no need to prepare the plurality of reticles. Consequently, it is possible to decrease the manufacturing costs for the semiconductor devices.

Whichever exposure tools 3a–3n is used, single OPC corrected reticle serves for printing the equivalent projected images on working wafers. Therefore, there is no need to choose one suitable exposure tool from the plurality of the exposure tools 3a–3n. Especially, when increasing production of the semiconductor devices is demanded urgently, it is possible to eliminate procedure for choosing one exposure tool that is suitable for the OPC corrected reticle.

(Other Embodiments)

Although the invention has been described above by reference to the embodiment of the present invention, the present invention is not limited to the embodiment described above. Modifications and variations of the embodiment described above will occur to those skilled in the art, in the light of the above teachings.

For example, the contrast evaluator 323 shown in FIG. 1 uses the insertion sort algorithm to rank the exposure tools 3a–3n hierarchically in the first embodiment. However, the shell sort algorithm and the merge sort algorithm also may be used for the ranking.

Further, the shape of the OPE test pattern used in the step S106 is not limited to the shape as shown in FIG. 4. Various transparent patterns, such as round shape, may be used for the OPE test pattern.

In the step S301 shown in FIGS. 8 and 11, the contrast of the (N−1)-th ranked exposure tool is decreased by tilting the wafer tilting stage 92 shown in FIG. 2. However, it is also possible to reduce the contrast of the (N−1)-th ranked exposure tool by tilting the reticle tilting stage 82. The tilting angle of the reticle tilting stage 82 is adjusted by the reticle stage aligner 97 with shafts 83a, 83b. Further, adjusting the projection optical system 42 to cause intended defocus is an alternative to decreasing the contrast of the (N−1)-th ranked exposure tool.

In the step and scan process, the depth of focus (DOF) tends to decrease when the number of the slits established in the slit plate is decreased. Therefore, replacing slit plates mounted in the exposure tool is also an alternative to decreasing the contrast of the (N−1)-th ranked exposure tool. For example, in the step S106 shown in FIG. 8, a first slit plate 44 having four slits 45a, 45b, 45c, 45d shown in FIG. 12 may be mounted in each slit holder 54 shown in FIG. 2 of the exposure tools 3a–3n shown in FIG. 1. Then, the first slit plate 44 mounted in the (N−1)-th ranked exposure tool may be replaced for a second slit plate 144 shown in FIG. 13 or a third slit plate 244 shown in FIG. 14 in the step S301. The second slit plate 144 shown in FIG. 13 has two slits 46a, 46b. The third slit plate 244 shown in FIG. 14 has a single slit 47. By replacing the slit plates, the contrast of the (N−1)-th ranked exposure tool may be decreased.

Figure 12:
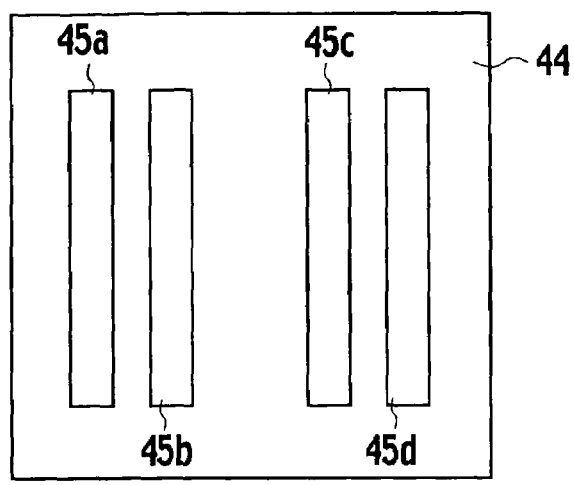
FIG. 12 is a first plan view of a first slit plate in accordance with the other embodiment of the present invention.
Figure 13:
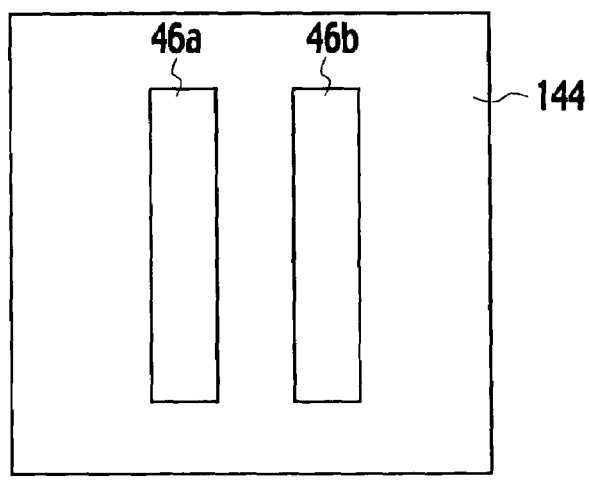
FIG. 13 is a second plan view of a second slit plate in accordance with the other embodiment of the present invention.
Figure 14:
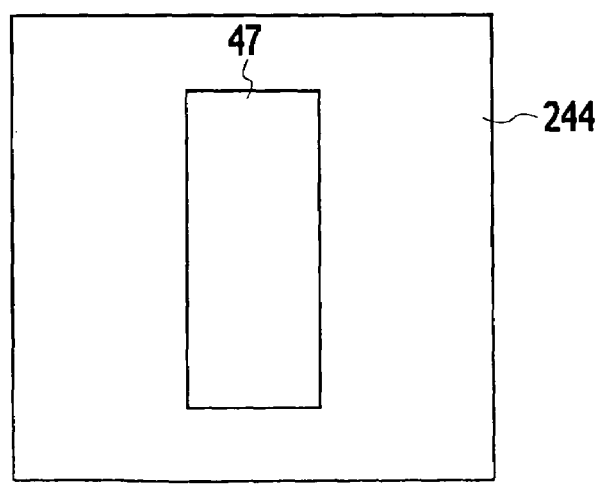
FIG. 14 is a third plan view of a third slit plate in accordance with the other embodiment of the present invention.

It should be noted that the slit plates mounted in the exposure tools 3a–3n are not limited to the first, second, and third slit plates 44, 144, 244 shown in FIGS. 12–14. Various shapes and number of the slits may be applied to decrease the (N−1)-th ranked exposure tool.

Figure 15:
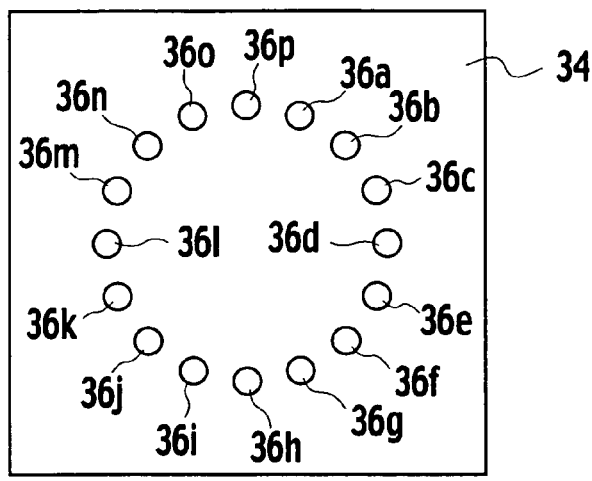
FIG. 15 is a first plan view of a first aperture diaphragm in accordance with the other embodiment of the present invention.

Further, the DOF tends to decrease when a ratio of a center brightness of the light emitted from the light source 41 to an off axis brightness of the light is increased. Therefore, replacing aperture diaphragms mounted in the exposure tool is also an alternative to decreasing the contrast of the (N−1)-th ranked exposure tool. With reference to FIG. 15, a first aperture diaphragm 34 has a plurality of apertures 36a, 36b, 36c, 36d, 36e, 36f, 36g, 36h, 36i, 36j, 36k, 36l, 36m, 36n, 36o, 36p. In the step S106, the first aperture diaphragm 34 may be mounted in each aperture diaphragm holder 58 shown in FIG. 2 of the exposure tools 3a–3n shown in FIG. 1, for example. The apertures 36a–36p may be arranged at off axis positions when the first aperture diaphragm 34 is mounted in each of the exposure tools 3a–3n. Then, the first aperture diaphragm 34 mounted in the (N−1)-th ranked exposure tool may be replaced by a second aperture diaphragm 134 shown in FIG. 16 or a third aperture diaphragm 234 shown in FIG. 17. The second aperture diaphragm 134 shown in FIG. 16 has six apertures 37a, 37b, 37c, 37d, 37e, 37f. The third aperture diaphragm 234 shown in FIG. 17 has single aperture 38. When the second or third aperture diaphragm 134, 234 is mounted in each of the exposure tools 3a–3n, the apertures 37a–37f or the aperture 38 may be arranged at a central region containing an optical axis. Therefore, by replacing the aperture diaphragms, the contrast of the (N−1)-th ranked exposure tool may be decreased.

Figure 16:
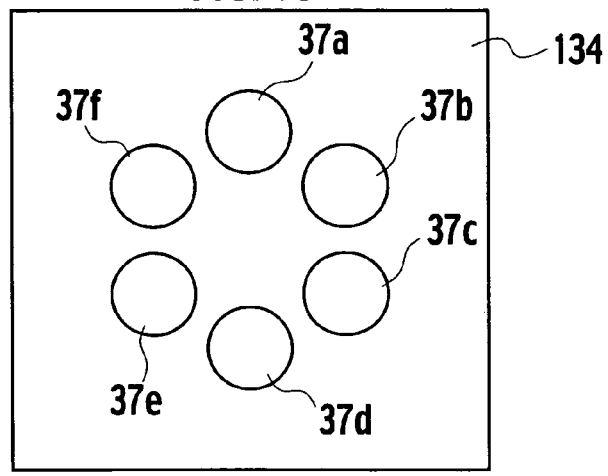
FIG. 16 is a second plan view of a second aperture diaphragm in accordance with the other embodiment of the present invention.
Figure 17:
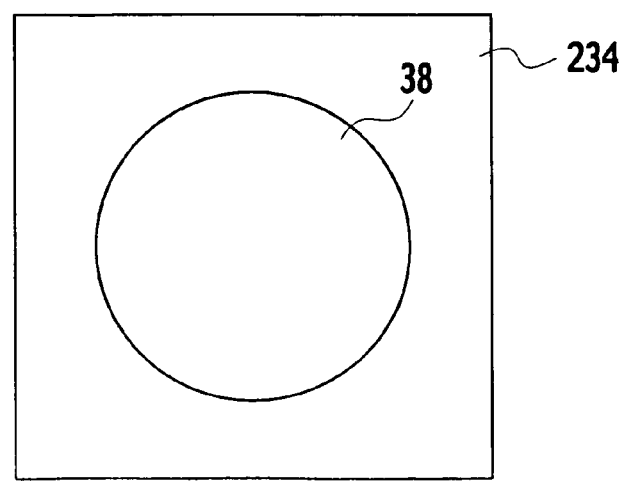
FIG. 17 is a third plan view of a third aperture diaphragm in accordance with the other embodiment of the present invention.

It should be noted that the aperture diaphragms mounted in the exposure tools 3a–3n are not limited to the first, second, and third aperture diaphragms 34, 134, 234 shown in FIGS. 15–17. Various shapes and number of the apertures may be applied to decrease the (N−1)-th ranked exposure tool.

As described above, the present invention includes many variations of embodiments. Therefore, the scope of the invention is defined with reference to the following claims.

What is claimed is:

1. A method for correcting a plurality of exposure tools comprising:
   projecting a standard pattern and a comparative pattern having a size which is different from the standard pattern, by each of the exposure tools at exposure conditions such that projected images of the standard pattern are equivalent in size;
   ranking the exposure tools based on contrasts of projected images of the comparative pattern exposed at the exposure conditions;
   projecting a first optical proximity test pattern containing a plurality of openings arranged at a first period and a second optical proximity test pattern containing the openings arranged at a second period by each of the exposure tools;
   determining whether optical proximity effects of the exposure tools are equivalent or not based on the projected images of the openings; and
   adjusting the contrasts of the images projected by the exposure tools so that all optical proximity effects of the exposure tools are equivalent to an optical proximity effect of the lowest ranked exposure tool having the lowest contrast.

2. The method of claim 1, wherein ranking the exposure tools further comprises:
   comparing sizes of the projected images of the comparative pattern;
   determining an exposure tool generating a larger size of the projected image of the comparative pattern than another as a higher contrast exposure tool.

3. The method of claim 1, wherein determining whether optical proximity effects of the exposure tools are equivalent or not further comprises comparing sizes of projected images of the first and second optical proximity test pattern.

4. The method of claim 1, wherein adjusting the contrasts of the images projected by the exposure tools further comprises tilting wafer stages of the exposure tools, respectively.

5. The method of claim 1, wherein adjusting the contrasts of the images projected by the exposure tools further comprises tilting reticle stages of the exposure tools, respectively.

6. The method of claim 1, wherein adjusting the contrasts of the images projected by the exposure tools further comprises defocusing projection optical systems of the exposure tools, respectively.

7. The method of claim 1, wherein adjusting the contrasts of the images projected by the exposure tools further comprises replacing a first slit plate mounted in each of the exposure tools with a second slit having a different number of slits than the first slit plate, respectively.

8. The method of claim 1, wherein adjusting the contrasts of the images projected by the exposure tools further comprises adjusting each aperture diaphragm mounted in the exposure tools to increase a ratio of a center brightness to an off axis brightness, respectively.

9. A method for manufacturing a semiconductor device comprising:
projecting a standard pattern and a comparative pattern having a size which is different from the standard pattern onto each of a plurality of contrast test wafers by a corresponding plurality of exposure tools at exposure conditions such that projected images of the standard pattern on the contrast test wafers are equivalent in size;
ranking the exposure tools based on contrasts of projected images of the comparative pattern on the contrast test wafers exposed at the exposure conditions;
projecting a circuit pattern of the semiconductor device onto each of a plurality of optical proximity effect test wafers by the exposure tools respectively;
determining whether optical proximity effects of the exposure tools are equivalent or not based on the projected images of the circuit pattern on the optical proximity effect test wafers;
adjusting the contrasts of the projected images of the circuit pattern on the optical proximity effect test wafers so that all optical proximity effects of the exposure tools is equivalent to an optical proximity effect of the lowest ranked exposure tool having the lowest contrast;
applying an optical proximity correction to the circuit pattern in order to reduce the equivalent optical proximity effect and generating corrected circuit pattern of the semiconductor device; and
projecting the corrected circuit pattern onto each of a plurality of working wafers on which the semiconductor device is supposed to be fabricated by the exposure tools.

10. The method of claim 9, wherein the ranking the exposure tools further comprises:
comparing sizes of the projected images of the comparative pattern on the contrast test wafers;
determining an exposure tool generating a larger size of the projected image of the comparative pattern on one of the contrast test wafers than another as a higher contrast exposure tool.

11. The method of claim 9, wherein determining whether optical proximity effects of the exposure tools are equivalent or not further comprises comparing sizes of projected images of the circuit pattern on the optical proximity effect test wafers.

12. The method of claim 9, wherein adjusting the contrasts of the projected images of the circuit pattern further comprises tilting wafer stages of the exposure tools respectively, the wafer stages being configured to hold the working wafers.

13. The method of claim 9, wherein adjusting the contrasts of the projected images of the circuit pattern further comprises tilting reticle-stages of the exposure tools respectively, each of the reticle stages being configured to hold a corrected circuit pattern reticle having the corrected circuit pattern.

14. The method of claim 9, wherein adjusting the contrasts of the projected images of the circuit pattern further comprises defocusing projection optical systems of the exposure tools, respectively.

15. The method of claim 9, wherein adjusting the contrasts of the projected images of the circuit pattern further comprises replacing a first slit plate mounted in each of the exposure tools with a second slit having a different number of slits than the first slit plate, respectively.

16. The method of claim 9, wherein adjusting the contrasts of the projected images of the circuit pattern further comprises adjusting each aperture diaphragm mounted in the exposure tools to increase a ratio of a center brightness to an off axis brightness, respectively.

* * * * *